(12) United States Patent
Aoki et al.

(10) Patent No.: US 7,939,171 B2
(45) Date of Patent: *May 10, 2011

(54) METAL-CONTAINING RESIN PARTICLE, METAL-CONTAINING RESIN LAYER, METHOD OF FORMING METAL-CONTAINING RESIN LAYER, AND SUBSTRATE FOR ELECTRONIC CIRCUIT

(75) Inventors: Hideo Aoki, Yokohama (JP); Naoko Yamaguchi, Yokohama (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 966 days.

This patent is subject to a terminal disclaimer.

(21) Appl. No.: 11/018,473

(22) Filed: Dec. 22, 2004

(65) Prior Publication Data

US 2005/0191511 A1 Sep. 1, 2005

(30) Foreign Application Priority Data

Dec. 26, 2003 (JP) ................ P2003-435757
Dec. 26, 2003 (JP) ................ P2003-435760

(51) Int. Cl.
*B32B 5/66* (2006.01)
(52) U.S. Cl. ........ 428/403; 428/407; 428/328; 174/256; 174/257; 174/258
(58) Field of Classification Search ................ 428/403, 428/407, 328; 174/256, 257, 258
See application file for complete search history.

(56) References Cited

U.S. PATENT DOCUMENTS

| 4,696,861 | A | 9/1987 | Tatematsu et al. |
| 4,897,326 | A | 1/1990 | Marengo |
| 6,214,508 | B1 | 4/2001 | Kamada et al. |
| 6,426,143 | B1 * | 7/2002 | Voss et al. ........ 428/378 |
| 6,440,625 | B1 | 8/2002 | Berlin |
| 2002/0012789 | A1 | 1/2002 | Iijima |
| 2004/0197487 | A1 | 10/2004 | Aoki et al. |
| 2005/0100720 | A1 | 5/2005 | Shirai et al. |

FOREIGN PATENT DOCUMENTS

| EP | 1 075 172 A1 | 2/2001 |
| EP | 1 113 091 A1 | 7/2001 |
| JP | 59-123848 | 7/1984 |
| JP | 2-53850 | 2/1990 |
| JP | 3-089359 | 4/1991 |
| JP | 4-237063 | 8/1992 |
| JP | 6-069618 | 3/1994 |
| JP | 07-263841 | 10/1995 |
| JP | 08-056077 | 2/1996 |
| JP | 11-243277 | 9/1999 |
| JP | 11-243278 | 9/1999 |
| JP | 11-243279 | 9/1999 |
| JP | 11-243280 | 9/1999 |
| JP | 11-354908 | 12/1999 |
| JP | 2001-265054 | 9/2001 |
| JP | 2001-284769 | 10/2001 |
| JP | 2002-42558 | 2/2002 |
| JP | 2003-262974 | * 9/2003 |
| KR | 10-2001-0041267 | 5/2001 |
| KR | 10-2001-0108271 | 12/2001 |
| TW | 499501 B | 8/2002 |
| TW | 531557 B | 5/2003 |

OTHER PUBLICATIONS

Office Action issued by the Japanese Patent Office on Apr. 17, 2007, for Japanese Patent Application No. 2003-435757, and English-language Summary thereof.
Chinese Patent Office Action mailed by the Chinese Patent Office on Aug. 10, 2007 in counterpart Chinese Application No. 2004101034389.
Yamaguchi, N. et al., "New Process of Manufacturing Printed Circuit Boards Using Electrophotography Technology", 2004 ICEP Proceedings, pp. 168-172, (Apr. 2004).
Aoki, H. et al., "Wiring Board and Multilayer Wiring Board", U.S. Appl. No. 10/896,054, filed Jul. 22, 2004.
Office Action issued by the Taiwanese Patent Office on Oct. 13, 2006, for Taiwanese Patent Application No. 09520835890, and English-language translation thereof.
Official Action issued by the Chinese Patent Office on Jun. 23, 2006, for Chinese Patent Application No. 200410103438.9, and English-language translation thereof.
Office Action issued by the Chinese Patent Office on Jan. 26, 2007, for Chinese Patent Application No. 2004101034389, and English-language summary thereof.

* cited by examiner

*Primary Examiner* — Leszek Kiliman
(74) *Attorney, Agent, or Firm* — Finnegan, Henderson, Farabow, Garrett & Dunner, L.L.P.

(57) ABSTRACT

Provided is metal-containing resin particle for forming a conductor pattern in which the metal particles are dispersed in a resin matrix, and the content of the metal particles is 70 wt % or less.

11 Claims, 11 Drawing Sheets

METAL-CONTAINING RESIN PARTICLE, METAL-CONTAINING RESIN LAYER, METHOD OF FORMING METAL-CONTAINING RESIN LAYER, AND SUBSTRATE FOR ELECTRONIC CIRCUIT

CROSS-REFERENCE TO RELATED APPLICATION

This application is based upon and claims the benefit of priority from the prior Japanese Patent Applications Nos. 2003-435757 and 2003-435760, filed on Dec. 26th, 2003; the entire contents of which are incorporated herein by reference.

BACKGROUND

1. Field of the Invention

The present invention relates to metal-containing resin particles, a metal-containing resin layer, a method of forming the metal-containing resin layer and a substrate for electronic circuit which can easily form an arbitrary electronic circuit by performing electroless plating with the metal particle as plating kernels after printing a resin which contains metal particles, for instance, by electrophotography.

2. Description of the Related Art

In a conventional method of producing a substrate for electronic circuit, a metal conductor pattern layer is formed by performing resist coating, exposure, development, etching and the like on a thin metal film. In this production process, exposure masks are needed for respective layers, which requires a plenty of times and costs of design and production thereof. Therefore, alternation or modification of a circuit pattern gives a great effect on the production period or costs of the substrate for electronic circuit Consequently, a method of forming a metal conductor pattern layer without using an exposure mask is developed, in which an underlying pattern layer having an arbitrary pattern is printed by electrophotography using charged particles which contain metal particles in a resin as toner, and electroless plating is conducted with fine metal particles in the printed underlying pattern layer as plating kernels.

When using the electrophotography, control of the amount of electrostatic charge of toners (charged particles) is an important factor in order to consistently print a minute pattern. Especially, in the case of toner which contains metal particles in its resin, since an electrostatically charged area on the toner surface becomes small due to exposure of the metal particles being a conductor on a portion of the surface, it becomes necessary to control the charge at an appropriate level. Moreover, shape and distribution of the metal particles contained in the printed pattern greatly influences the deposition property of plating and adherent property between the metal conductor pattern layer and a base metal at the time of electroless plating.

The fine metal particles existing on a surface on which electroless plating of an underlying pattern layer is given are covered with resin immediately after the printing, and cannot sufficiently exhibit the function as a plating kernel if they are left untouched. Therefore, it is necessary to expose the fine metal particles on the surface by etching the resin covering the fine metal particles mechanically or chemically.

However, since mechanical etching is apt to actualize a problems in flatness of the substrate, it is not suitable for etching a wide area. Accordingly, chemical etching is recommended especially for such wide areas. However, in chemical etching, the solubility of resin sometimes greatly influences the adherence between the metal conductor pattern layer and the substrate after plating. For instance, when resin is not sufficiently dissolved and fine metal particles are not sufficiently exposed on the surface even when chemical etching is performed, there was a problem that a plating layer is seldom or never deposited after electroless plating.

An object of the present invention is therefore to provide metal-containing resin particles, a metal-containing resin layer, a method of forming the metal-containing resin layer and a substrate for electronic circuit, which can control the distribution of the amount of electric charge in the toner containing the fine metal powder in the resin by controlling the particle size, shape, and content of the fine metal particles contained in the resin so that a minute pattern can be formed, and further, can improve deposition property of plating in the electroless plating.

Another object of the present invention is to provide metal-containing resin particles, a metal-containing resin layer, a method of forming the metal-containing resin layer and a substrate for electronic circuit, which effectively performs electroless plating to thereby form a metal conductor pattern layer rather more uniform by forming a layer capable of easily controlling the etching thickness on the surface of an underlying pattern layer for forming the pattern.

BRIEF SUMMARY OF THE INVENTION

According to one mode of the present invention, a metal-containing resin particle for forming a conductor pattern in which the metal particles are dispersed in a resin matrix is provided, in which the content of the fine metal particles is 70 wt % or less of the whole.

Also, according to another mode of the present invention, a metal-containing resin particle for forming a conductor pattern comprises a resin matrix composed of thermosetting resin, metal particles disposed in the resin matrix, and an additive contained in the resin matrix and having smaller specific gravity than that of the resin material composing the resin matrix.

Further, according to still another mode of the present invention, a resin layer containing fine metal particles formed on a substrate with thermosetting resin containing at least fine metal particles is provided, in which the content of the metal particles is 70 wt % or less of the whole and number density of the contained fine metal particles in a prescribed range of particle size is 0.05 pieces/$\mu m^3$ or more.

And according to yet another mode of the present invention, a metal-containing resin layer formed on a substrate with at least thermosetting resin containing metal particles, is provided, in which a percentage of hardening of the thermosetting resin in the resin layer containing the fine metal particle before the electroless plating process is 50% or more.

According to another mode of the present invention, provided is a method of forming a metal-containing resin layer, which comprises: forming an electrostatic latent image of a prescribed pattern on a photosensitive body; forming a visible image on the photosensitive body on which the electrostatic latent image is formed by electrostatically attaching metal-containing resin particles at 70 wt % or less of the whole dispersed on the resin matrix, and number density of the metal particles contained in the range of prescribed particle size being 0.05 piece/$\mu m^3$ or more; electrostatically transferring the visible image consisting of the metal-containing resin particles formed on the above-described photosensitive body on the substrate; and fixing on the substrate the metal-containing resin particles transferred on the above-described substrate, by heat or light irradiation.

Further, according to still another mode of the present invention, provided is a method of forming a metal-containing resin layer, which comprises: forming an electrostatic latent image of a prescribed pattern on a photosensitive body; forming a visible image on the photosensitive body on which the electrostatic latent image is formed, by electrostatically attaching metal-containing resin particles which contains the metal particles dispersed in a resin matrix, and to which an additive having smaller specific gravity than that of the resin material composing the resin matrix is added; electrostatically transferring the visible image composed of the metal-containing resin particles formed on the photosensitive body onto the substrate; and fixing the metal-containing resin particles transferred onto the substrate to the substrate by heat or light irradiation while hardening the resin particles to a degree of 50% or more in percentage of hardening of the resin matrix.

Further, according to yet another mode of the present invention, provided is a substrate for electronic circuit which comprises a conductor pattern layer formed by using the metal-containing resin particles according to the above-described one mode of the present invention.

BRIEF DESCRIPTION OF THE DRAWINGS

The present invention will be described with reference to the drawings, but these drawings are presented only for illustrative purposes and are never intended to limit the present invention.

DETAILED DESCRIPTION OF THE INVENTION

Embodiments of the present invention will be explained with reference to the drawings as follows.

First Embodiment

Figure 1:
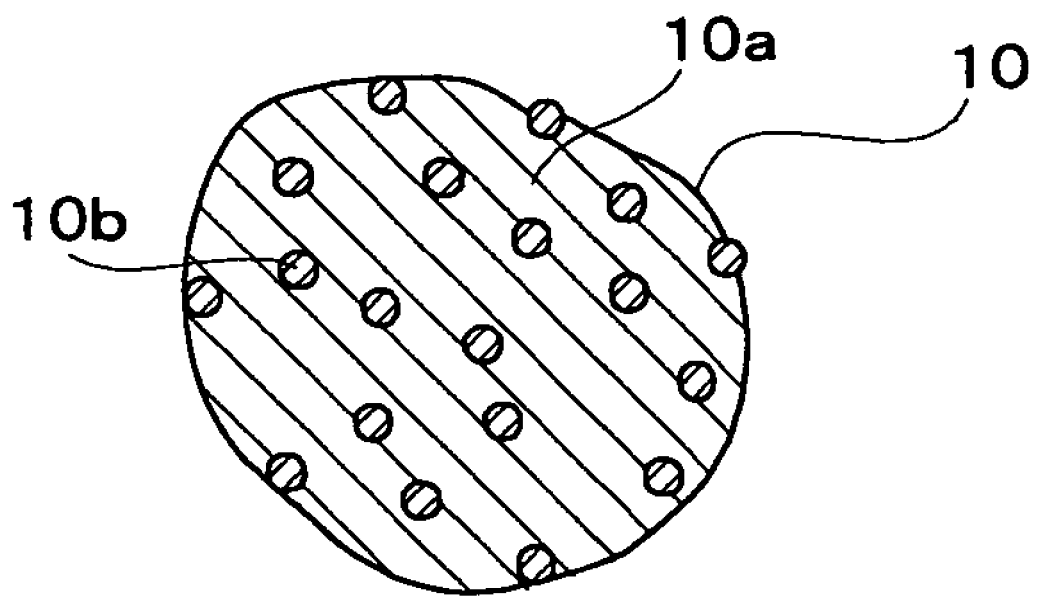
FIG. 1 is a sectional view of metal-containing resin particles according to a first embodiment of the present invention.

FIG. 1 shows an outline of a sectional view of a metal-containing resin particle 10 in a first embodiment of the present invention.

The metal-containing resin particle 10 is mainly composed of a resin matrix 10a as shown in FIG. 1, in which conductive fine metal particles 10b are nearly uniformly contained in dispersion.

The particle size of the metal-containing resin particles 10 is desirably small for necessity of forming a fine wiring pattern, and is formed, for instance, in a range from 4 μm to 10 μm in average particle size.

For the resin matrix 10a composing the metal-containing resin particle 10, a thermosetting resin in B-stage which is a solid state at room temperatures is used. Here, the B-stage refers to a state in which at least one portion of the thermosetting resin is not hardened but melted when prescribed heat is applied. As the thermosetting resin in B-stage, epoxy resin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and soon can be used, and an electrostatic charge control agent can be added thereto as necessary.

For the conductive fine metal particles 10b, at least one kind of fine metal particles selected from the group consisting of platinum (Pt), palladium (Pd), copper (Cu), gold (Au), nickel (Ni), and silver (Ag) is used. The average particle size of the fine metal particle 10b is desirably in a range from 0.05 μm to 3 μm, more desirably in a range from 0.1 μm to 2 μm. This is because the smaller the average particle size of the fine metal particles 10b, the better in dispersibility. The fine metal particles are not limited to a spherical shape. It is also acceptable for them to be formed, for instance, in a scale-like shape obtained by crushing a spherical fine metal particle 10b. The shape of the metal particle 10b contained in the metal-containing resin particle 10 can be only a spherical shape, only a scale shape, or a mixture of a spherical shape and a scale shape.

Furthermore, an upper limit content of the fine metal particles 10b contained in the metal-containing resin particle 10 in dispersion is 70 wt % of the metal-containing resin particle 10, and the lower limit thereof is 0.05 piece/$\mu m^3$ which is defined by number density of the fine metal particles 10b dispersed in the metal-containing resin particle 10. When the content of the fine metal particles 10b is 70 wt % or more, a printing pattern is not likely to be properly formed. When number density of the fine metal particles 10b is 0.05 piece/$\mu m^3$ or less, a function of the fine metal particles 10b as a plating kernel is sometimes lowered. Furthermore, more desirable content of the fine metal particles 10b contained in the metal-containing resin particle 10 is from 30 to 60 wt %.

Next, forming processes of a conductor pattern layer by an electrophotography will be explained with reference to FIG. 2A to FIG. 2C and FIG. 3.

Figure 2A:
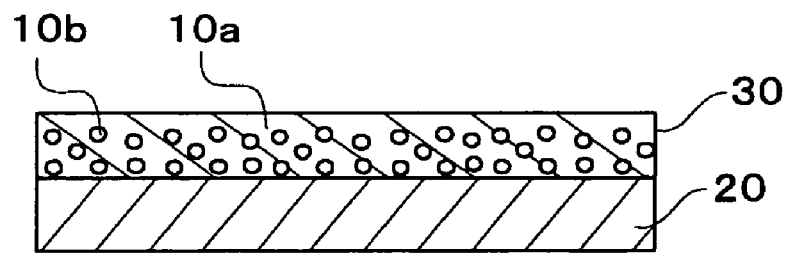
FIG. 2A is a sectional view of a conductor pattern layer in a prescribed forming process according to the first embodiment of the present invention.
Figure 2B:
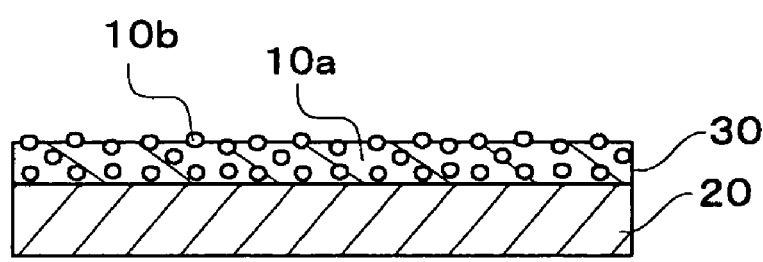
FIG. 2B is a sectional view of the conductor pattern layer in the prescribed forming process according to the first embodiment of the present invention.
Figure 2C:
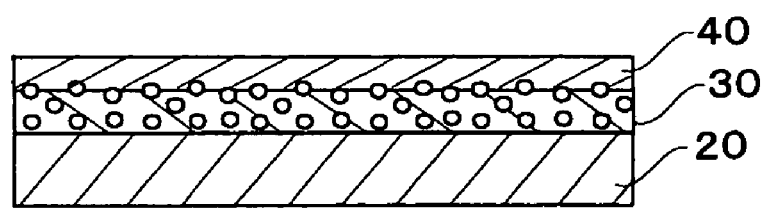
FIG. 2C is a sectional view of the conductor pattern layer in the prescribed forming process according to the first embodiment of the present invention.
Figure 3:
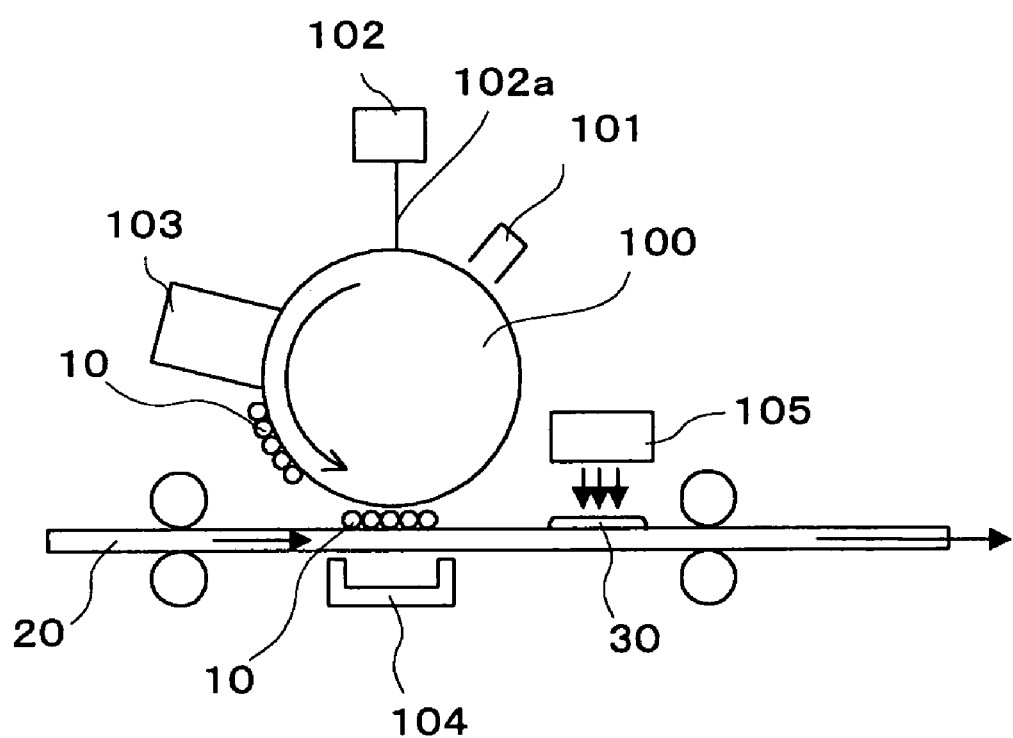
FIG. 3 is a schematic diagram of a production apparatus for forming the conductor pattern layer according to the first embodiment of the present invention.

Sectional views in respective forming processes of conductor pattern are shown from FIG. 2A to FIG. 2C. FIG. 3 shows a schematic diagram of a production apparatus for forming the conductor pattern.

First, while a photosensitive body drum 100 is turned along the arrow direction, a surface potential of the photosensitive body drum 100 is uniformly charged at a fixed potential (for instance, minus charge) by an electrostatic charger 101. Next, a laser beam 102a is irradiated to the photosensitive body drum 100 in response to an image signal by a laser generator and scanner 102 removing the minus charge in the irradiated portion to form a charged image (electrostatic latent image) of a prescribed pattern on the surface of the photosensitive body drum 100.

Next, electrostatically charged metal-containing resin particles 10 stored in a developing machine 103 are electrostatically attached on the electrostatic latent image on the photosensitive body drum 100 by means of a feeder to obtain a visible image.

Then, the visible image (pattern) formed with the metal-containing resin particles 10 on the surface of the photosensitive body drum 100 is electrostatically transferred on a desired substrate 20 from the photosensitive body drum 100 by a copier 104.

Then, the metal-containing resin particles 10 in B-stage, which are transferred onto the substrate 20, pass through a fixing apparatus 105 which emits heat or light, so that a thermosetting resin composing the metal-containing resin particles 10 is melted and harden to form a metal-containing resin layer 30 to which the metal-containing resin particles 10 are unified (FIG. 2A).

It should be noted that the thermosetting resin is not required to be hardened completely in the fixing apparatus 105, it is desirable to harden the thermosetting resin to a degree that the fine metal particles 10b do not drop out of the layer of the resin matrix 10a when performing, for instance, etching in a resin etching apparatus which will be described later.

Then, in order to effectively perform the electroless plating, the surface of the metal-containing resin layer 30 is etched in a resin etching apparatus (not shown), so that at least one portion of the fine metal particles 10b is exposed from the surface of the metal-containing resin layer 30 (FIG. 2B).

This resin etching apparatus performs chemically etching by immersing the surface of the metal-containing resin layer 30 with, for instance, a solvent such as aceton, or isopropanol, or an etching solution such as acid or alkali. Besides, in addition to perform chemically etching, the resin etching apparatus can perform mechanically etching by polishing such as shot blasting or airblasting.

Then, etching process is performed and the metal-containing resin layer 30 having at least a portion of the fine metal particles 10b exposed on the surface thereof, is processed with, for instance, copper plating in an electroless plating bath (not shown) so that copper is selectively deposited utilizing the fine metal particles 10b exposed on the metal-containing resin layer 30 as kernels to thereby form a conductor metal layer 40 (FIG. 2C).

It should be noted that the plating bath composed of only an electroless plating bath, it is not limited to this bath, it is also available to use a plating bath which carries out both of electroless plating and electroplating.

When the metal-containing resin layer 30 is not completely hardened, since plating process can be conducted by removing the resin on the surface of the metal-containing resin layer 30 during plating by employing an alkaline plating solution, the etching process using the resin etching apparatus can be omitted.

The thickness of the conductor metal layer 40 formed on the surface of the metal-containing resin layer 30 can be controlled based on plating conditions. In order to make the substrate 20 and the metal-containing resin layer 30 come into contact more closely, and prevent from peeling, it is desirable to completely harden the metal-containing resin layer 30 by heat or light irradiation with the fixing apparatus 105, after the plating.

In the metal-containing resin particles 10 according to the first embodiment of the present invention, by appropriately determining the content of metal particles 10b contained in dispersion in the resin matrix 10a composing the metal-containing resin particles 10, distribution of the amount of electrostatic charge of the metal-containing resin particles is controlled, so that a minute pattern can be formed. Besides, by making the shape of the fine metal particles 10b a scale shape, adherence between the underlying pattern layer and the metal conductor layer formed on the surface thereof is made excellent and the anchor effect is improved. Moreover, deposition property of plating in the electroless plating can be improved.

A production apparatus and a production process using such an electrophotography are used in an ordinary copier or a laser printer, and an arbitrary conductor pattern layer can be formed by inputting digitized data. In terms of usage, it is not limited only to an electronic circuit and a wiring substrate, but can be used in a wide range of applications such as forming an arbitrary conductor pattern layer on a flat substrate other than the above-described applications.

A concrete examples relating to the metal-containing resin particles 10 will be described below.

EXAMPLE 1

In example 1, as for the metal-containing resin particles 10 shown in FIG. 1, six kinds of metal-containing resin particles 10 containing 0 (resin only), 20, 50, 70, 80, and 90 wt % of fine copper particles dispersed in a resin mainly composed of epoxy resin were prepared to measure the amount of electrostatic charge. The average particle size of the metal-containing resin particles 10 ranged from 7.3 to 9.0 µm.

Figure 4:
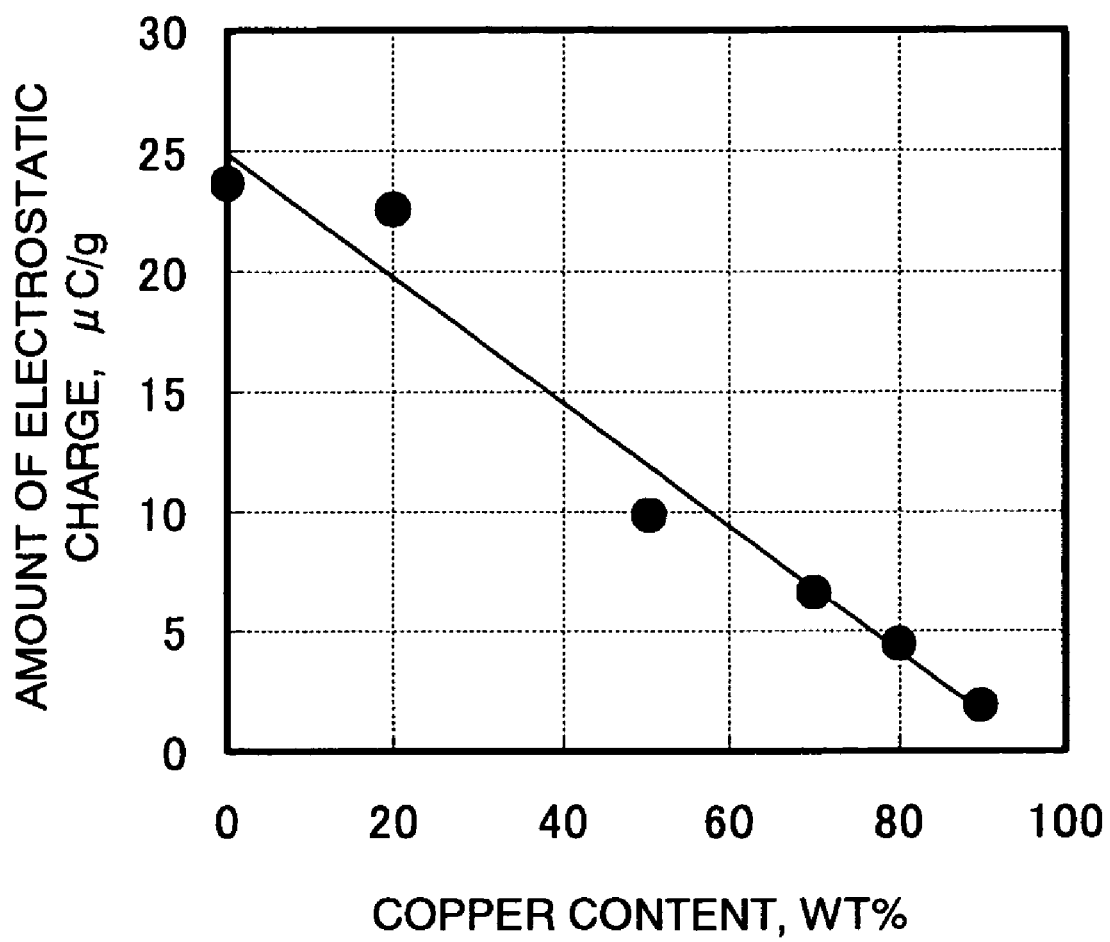
FIG. 4 is a graph showing a measurement result of the amount of electrostatic charge of 6 kinds of metal-containing resin particles.

FIG. 4 shows the measurement result of an amount of electrostatic charge among the above-described six kinds of metal-containing resin particles 10.

This measurement result shows that the amount of electrostatic charge per unit mass of the metal-containing resin particles 10 is decreased and is about 1.9 µC/g in the amount of electrostatic charge at 90 wt %, being less than 5 µC/g which is a lower limit of the amount of electrostatic charge with which an ordinary dry copier is able to develop.

Figure 5:
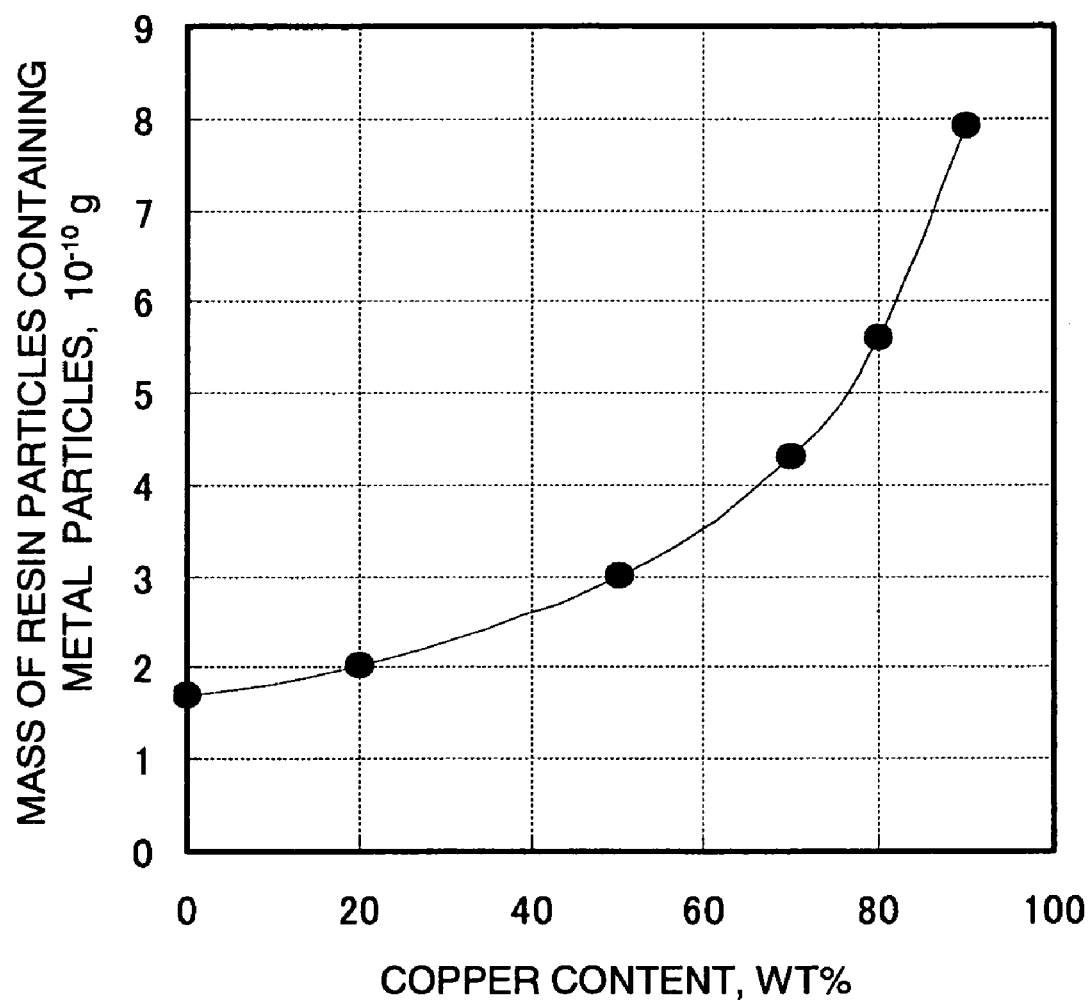
FIG. 5 is a graph showing relations between the content of copper and the mass of the metal-containing resin particles.

Next, FIG. 5 shows relations between the content of copper and the mass of the metal-containing resin particles 10, when the content of copper contained in the metal-containing resin particles 10 is varied at a constant particle size of the metal-containing resin particles 10.

This measurement result shows that the mass of the metal-containing resin particles 10 rapidly increases when the content of copper is 60 wt % or higher. However, since the amount of electrostatic charge of the metal-containing resin particles 10 is nearly proportional to the surface thereof, if the diameter of the metal-containing resin particles 10 is constant, the amount of electrostatic charge of the metal-containing resin particles 10 is constant.

Here, when the force affecting the metal-containing resin particles 10 is simply considered to be only a Coulomb force generated by an electric field given in the development process, the following relation is realized.

$$qE \sim m \cdot dv/dt,$$

where "q" designates amount of electrostatic charge of the metal-containing resin particles 10, "E" designates a given electric field, "m" designates the mass of the metal-containing resin particles 10, and dv/dt designates acceleration.

Assuming that the amount of electrostatic charge "q" of the metal-containing resin particles 10 is constant and the mass "m" of the metal-containing resin particles 10 is increased to three times as much as the original mass, the electric field "E" given in the development process must also be increased three fold to maintain the same development speed, which is not practical. If a strong electric field is allowed to exist between the photosensitive body and the developing machine during the development process, a well known phenomenon called charge injection in which a charge electrically opposite to that of the metal-containing resin particles 10 flows from the metal-containing resin particles 10 into a photosensitive body, takes place and this phenomenon easily occur when the electric field "E" is made large.

When the metal-containing resin particles 10 containing the above-described fine copper particles in dispersion was used to print with an actual copier, the metal-containing resin particles 10 begin to scatter around the surrounding of a printed pattern when the content reaches 80 wt %, and a contrast between the printed pattern and non-printed portion could hardly be recognized at 90 wt %.

From the above measurement result, it was found that in the metal-containing resin particles 10, by setting the content of the fine metal particles 10b at 70 wt % or lower of the whole of the metal-containing resin particles 10 and by appropriately control the amount of electrostatic charge and the mass of the metal-containing resin particles 10, an underlying pattern for plating good in contrast between the printed pattern and the non-printed portion and good in resolution was able to be formed. The lower limit value of the content of copper was determined by particle size of the fine copper particles contained in the metal-containing resin particles 10 and deposition property of the electroless plating, and as shown in example 2 which will be described later, for instance, in the case of using fine copper particles having the average particle size of 1.1 μm, the lower limit value of the content of copper was 15 wt %.

EXAMPLE 2

In example 2, in the metal-containing resin particles 10, five kinds of metal-containing resin particles 10 which contained 50 wt % of fine copper particles having average particle sizes of 0.7, 0.9, 1.1, 2.0 and 2.9 μm respectively were prepared by dispersing them in a resin mainly composed of epoxy resin. Then, using respective metal-containing resin particles 10, the underlying pattern layer (metal-containing resin layer 30) was formed on the substrate by the above-described method of forming the conductor pattern layer, and performs electroless plating process. The average particle size of prepared metal-containing resin particles 10 was in the range from 7.0 to 11.0 μm.

Figure 6A:
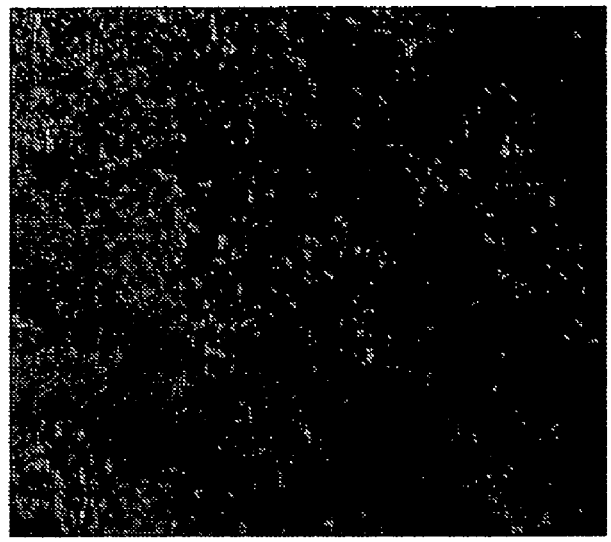
FIG. 6A is a view showing an appearance of deposition of plating on a plating layer.
Figure 6B:
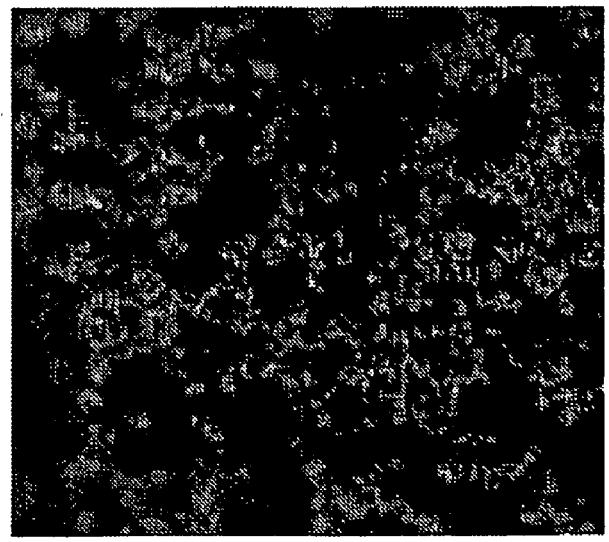
FIG. 6B is a view showing an appearance of deposition of plating on another plating layer.

FIGS. 6A and 6B show appearances of forming underlying pattern layer with the metal-containing resin particles 10 which contain the fine copper particles having an average particle size of 0.7 μm in FIG. 6A and an average particle size of 2.9 μm in FIG. 6B in dispersion, and depositing the plating on the plating layer on which electroless plating process is given. Note that the appearance of the deposition of plating was taken photograph by an electron microscope.

As shown in FIG. 6B, it is found that in the case of containing the fine copper particles having the average particle size of 2.9 μm, a distance between the deposited fine copper particles is long, showing the deposition of plating being loose. On the other hand, though not shown, in the case of containing the fine copper particles having the average particle size of 2.0 or lower, a nearly uniform and minute plating layer was formed. Especially, in the cases of containing the fine copper particles having average particle sizes of 0.7, 0.9 and 1.1 μm, uniform and minute plating layers were formed, as in FIG. 6A showing the case of having the average particle size of 0.7 μm as an example.

In three kinds of metal-containing resin particles 10, in which fine copper particles having average particle sizes of 0.7, 1.1, and 2.0 μm respectively were dispersed in a resin mainly composed of epoxy resin, the metal-containing resin particles 10 containing 30 wt % of the fine copper particles were made. Then, the underlying pattern layers using the metal-containing resin particles 10 were formed in a similar manner as the case of containing them at 50 wt %, and the appearance of deposition of plating on the plating layers processed by electroless plating was observed.

As a result, in the case of containing fine copper particles having average particle sizes of 0.7, and 1.1 μm, uniform and minute plating layers excellent in deposition property of plating were formed. On the other hand, in the case of containing fine copper particles having average particle size of 2.0 μm, deposition of plating was loose.

Further, in three kinds of resin particles containing fine metal particles 10, in which fine copper particles having average particle sizes of 0.7, 1.1, and 2.0 μm respectively were dispersed, resin particles containing fine metal particles 10 containing 15 wt % of the fine copper particles were made. Then, the underlying pattern layers using the resin particles containing fine metal particles 10 are formed, and the appearance of deposition of plating on the plating layers processed by electroless plating was observed.

As a result, in the case of containing fine copper particles of 0.7 μm in average particle size, a plating layer more uniform and minute than the case of containing fine copper particles having the average particle size of 1.1 μm was formed.

Figure 7:
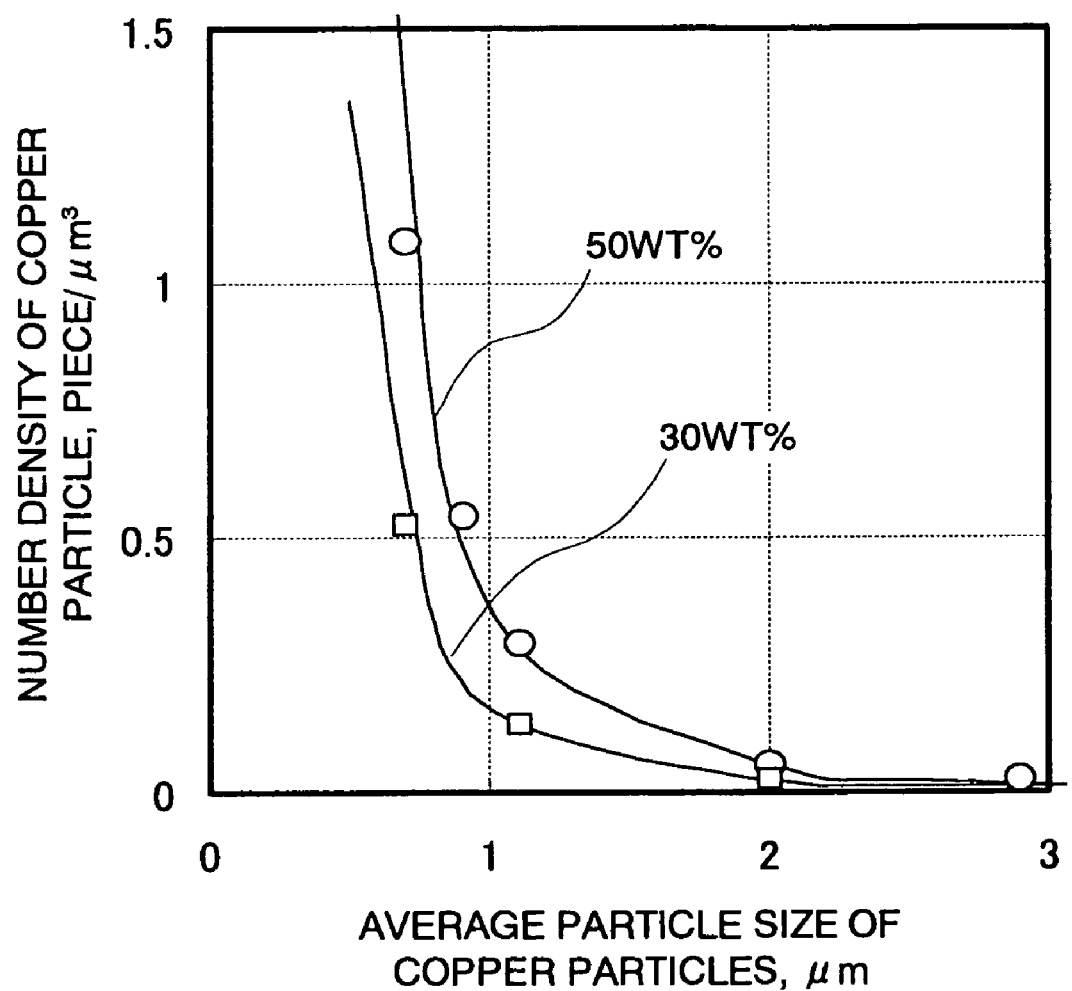
FIG. 7 is a view showing relations between number density of fine copper particles and average particle size.

Next, relation between number density of fine copper particles dispersed in the metal-containing resin particles 10 and the average particle size of fine copper particles is shown in FIG. 7. The number density of the fine copper particles dispersed in the metal-containing resin particles 10 can be calculated from the average particle size of the metal-containing resin particles 10, the average particle size of the fine copper particles, the content of copper, the specific gravity of applied copper and the resin matrix 10a.

FIG. 7 shows relations between number density of the fine copper particles and particle size of the fine copper particles in five kinds of metal-containing resin particles 10 which contain 50 wt % of fine copper particles having average particle sizes of 0.7, 0.9, 1.1, 2.0 and 2.9 μm respectively in dispersion in a resin mainly composed of epoxy resin. Moreover, FIG. 7 also shows relations between number density of the fine copper particles and particle sizes of the fine copper particles in three kinds of metal-containing resin particles 10 which contain 30 wt % of fine copper particles having average particle sizes of 0.7, 1.1, 2.0 μm respectively in dispersion in a resin mainly composed of epoxy resin.

From the measurement result and evaluation of the above-described deposition property of plating, deterioration in deposition property of the electroless plating is found to take place under the conditions that the number density of the fine copper particles dispersed in the metal-containing resin particles 10 is less than 0.05 piece/μm$^3$. This is because the probability of existence of the fine copper particles on the surface of the underlying pattern layer is lowered.

From the above-described results, it is found that the deposition property of plating by means of electroless plating can be improved and an uniform and minute plating layer can be formed by making the number density of the fine copper particles dispersed in the metal-containing resin particles 10 to be 0.05 piece/μm$^3$ or more in the metal-containing resin particles 10.

The upper limit of number density of the fine copper particles dispersed in the metal-containing resin particles 10 is determined by the particle size of the fine copper particles and the amount of electrostatic charge of the metal-containing resin particles 10, and when using the fine copper particles having an average particle size of 0.7 μm, the number density is 2.3 piece/μm$^3$. If the upper limit is shown by content of the metal-containing resin particles 10, it is 70 wt % as shown in example 1.

EXAMPLE 3

In example 3, in the metal-containing resin particles 10 shown in FIG. 1, the metal-containing resin particles 10 which contained 50 wt % of a resinous substance which was made by dispeersing scale-shaped fine copper particles made by crushing the fine copper particles having the average particle size of 0.7 μm into particles having a maximum diameter of 0.8 μm in a resin mainly composed of epoxy resin, was prepared. Further, metal-containing resin particles 10 which contain 50 wt % of a resinous substance which was made by dispersing spherical fine copper particles having the average particles size of 0.7 μm in a resin mainly composed of epoxy resin, was also prepared.

Figure 8:
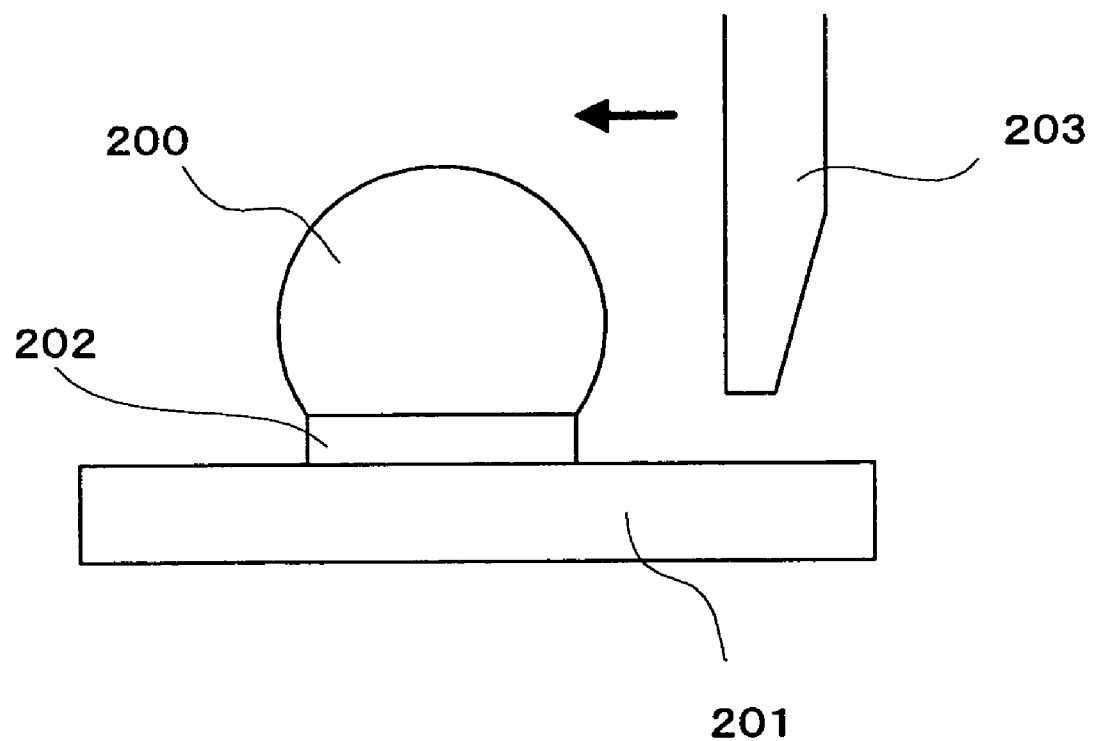
FIG. 8 is a view showing a schematic diagram of a welding strength test of a solder ball.

Then, using these two kinds of metal-containing resin particles 10, underlying pattern layers (metal-containing resin layer 30) having a diameter of 0.55 mm, and a thickness of about 3 μm were formed on substrates respectively by the method of forming the conductor pattern layer, and copper layers having a thickness of 10 μm were formed by electroless copper plating. Thereafter, nickel layers having a thickness of 2 μm were formed by electroless nickel plating, and gold layers having a thickness of 0.5 μm were formed by electoless gold plating. Further, as shown in FIG. 8, a solder ball 200 having a diameter of 0.6 mm formed from SnAg0.7Cu was welded on the gold layer by a reflow oven having a peak temperature of 260° C. to carry out a solder ball weld strength test.

In the solder ball weld strength test, the share strength was measured by applying load to the solder ball 200 welded on the gold layer of the conductor pattern layer 202 formed on a substrate 201 by a sharing tool 203. As a result, about 10% of improvement in strength was recognized in the shear strength in the conductor pattern layer formed by using the metal-containing resin particles 10 in which the scale-shaped fine copper particles were dispersed compared with the shear strength in the conductor pattern layer formed by using the resin particles containing fine metal particles 10 in which the spherical fine copper particles were dispersed.

From the results described above, it was found that as for the shape of fine metal particles 10*b* dispersed in the resin particles containing fine metal particles 10, a scale-shape derived from a sphere by deforming is more excellent in adherence between the underlying pattern layer and the metal conductor layer formed on the surface thereof, and was more improved in anchor effect than a spherical shape.

Second Embodiment

Figure 9:
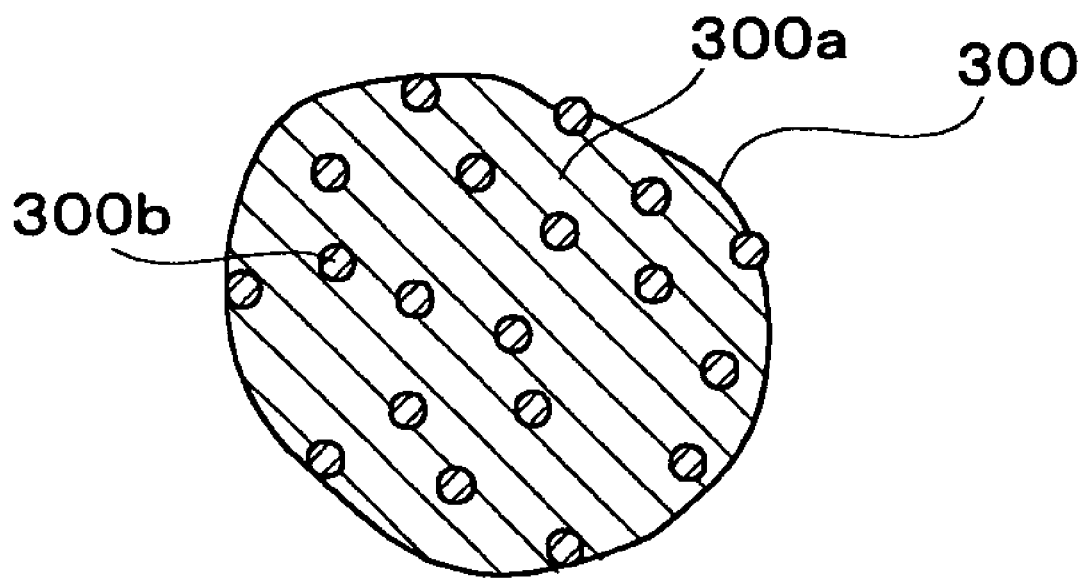
FIG. 9 is a sectional view of metal-containing resin particle according to a second embodiment of the present invention.

FIG. 9 shows a schematic diagram of a sectional view of a metal-containing resin particle 300 according to a second embodiment of the present invention.

The metal-containing resin particle 300 is mainly composed of a resin matrix 300*a* and conductive fine metal particles 300*b* are contained therein in a state of nearly uniform dispersion. An additive such as oil or fat smaller in specific gravity than resin material composing the resin matrix 300*a* is added to the metal-containing resin particle 300.

A smaller particle size of the metal-containing resin particle 300 is more desirable for the necessity of forming a fine wiring pattern, and therefore, it is formed, for instance, in a range from 4 μm to 10 μm in average particle size.

A thermosetting resin in a B-stage solid at room temperatures is used for a resin matrix 300*a* composing the metal-containing resin particles 300. As the thermosetting resin in B-stage, epoxyresin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and so on can be used.

For the conductive fine metal particles 300*b*, at least one kind of fine metal particles selected from the group consisting of platinum (Pt), palladium (Pd), copper (Cu), gold (Au), nickel (Ni), and silver (Ag). The average particle size of the fine metal particle 300*b* is desirably in a range from 0.05 μm to 3 μm, more desirably in a range from 0.1 μm to 2 μm. This is because the smaller the average particle size of the fine metal particles 10*b*, the better the dispersibility.

Besides, the fine metal particles 300*b* are contained in a rate of 15 to 70 wt % in the metal-containing resin particle 300, serve as kernels for electroless plating and have a catalytic function for progress of a plating reaction. When the content of the metal-containing resin particle 300 is smaller than 15 wt %, the function as a plating kernel for the fine metal particles 300*b* may be reduced. When the content of the metal-containing resin particle 300 is larger than 70 wt %, printing patterns may not be suitably formed. The more desirable content of the conductive fine metal particles 300*b* contained in the metal-containing resin particle 300 is from 30 to 60 wt %.

The additive is composed of oil or fat such as vegetable wax or the like having specific gravity of 1.1 or lower (at 25° C.) and is added to the resin matrix 300*a* in the range of 0.5 vol % or more of the total volume of the resin matrix 300*a*. If the amount of the additive is less than 0.5 vol %, sometimes the plating kernel may not be partially exposed, which may cause a bad influence upon deposition of plating. There is no specific upper limit for the amount of the additive, but if the amount of addition is too much, the thickness of the printing pattern after etching treatment becomes too thin, therefore the amount of addition is desirably as small as possible.

Next, forming processes of a conductor pattern layer by electrophotography will be explained with reference to FIGS. 10A to 10C.

Figure 10A:
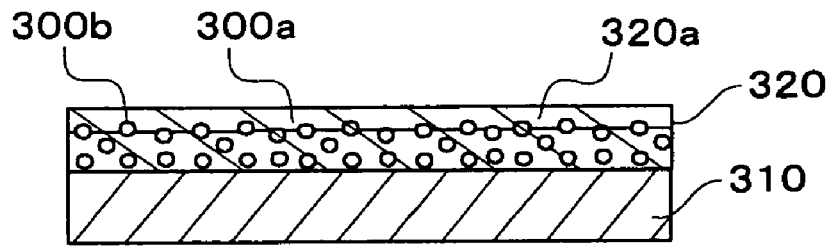
FIG. 10A is a sectional view of a conductor pattern layer in a prescribed forming process according to the second embodiment of the present invention.
Figure 10B:
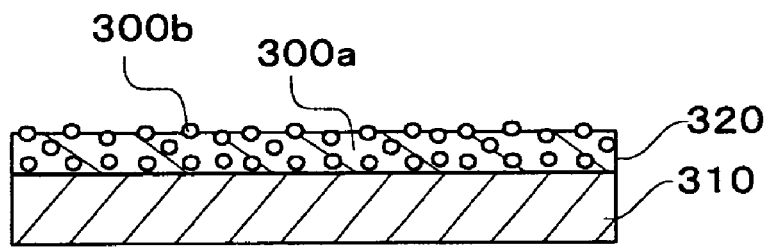
FIG. 10B is a sectional view of the conductor pattern layer in the prescribed forming process according to the second embodiment of the present invention.
Figure 10C:
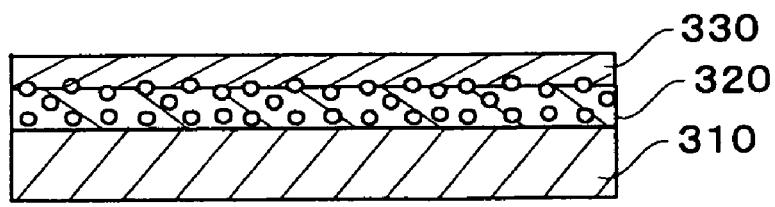
FIG. 10C is a sectional view of the conductor pattern layer in the prescribed forming process according to the second embodiment of the present invention.

FIG. 10A to FIG. 10C show cross-sections in respective forming processes of the conductor pattern layer. Since a production apparatus to form the conductor pattern layer is the same as same as the production apparatus in the first embodiment, explanation will be made with reference to the production apparatus shown in FIG. 3.

First, the surface potential of the photosensitive body drum 100 is uniformly charged at a constant potential (for instance, a minus charge) by the electrostatic charger 101 while the photosensitive body drum 100 is turned along the arrow direction. Then, the laser beam 102*a* is irradiated to the photosensitive body drum 100 in response to an image signal by a laser generator and scanner 102 to remove the minus charge in the irradiated portion so that a charged image (electrostatic latent image) of a prescribed pattern is formed on the surface of the photosensitive body drum 100.

Next, a visible image is formed on the electrostatic latent image of the photosensitive body drum 100 by electrostatically attaching the charged-metal-containing resin particles 300 stored in a developing machine 103 by a feeder.

Then, the visible image (pattern) formed with the metal-containing resin particles 300 on the surface of the photosensitive body drum 100 is electrostatically transferred to a desired substrate 310 from the photosensitive body drum 100 by a copier 104.

Subsequently, the resin particles containing fine metal particles in B-stage, which are transferred onto the substrate 310 pass through the fixing apparatus 105 with heat or light irradiation so that the thermosetting resin composing the metal-containing resin particles 300 is melted and hardened to form a metal-containing resin layer 320 to which the metal-containing resin particles 300 are unified (FIG. 10A).

Since an additive such as oil or fat, which is smaller in specific gravity than a resin material composing the resin matrix 300a is contained in the metal-containing resin particles 300 hardened in the fixing apparatus 105, a surface layer 320a composed of the additive is formed affected by the specific gravity on the upper surface of the metal-containing resin layer 320.

It should be noted that the resin matrix 300a is not necessarily completely hardened in the fixing apparatus 105, but it is desirable to be hardened to an extent that, for instance, the fine metal particles 300b do not drop out of the layer of resin matrix 300a at the time of etching process in a resin etching apparatus which will be described later.

Subsequently, in order to effectively carry out electroless plating, the surface of the metal-containing resin layer 320 is etching-processed in a resin etching apparatus (not shown) to expose at least one portion of the fine metal particles 300b on the surface of the metal-containing resin layer 320 (FIG. 10B).

In this resin etching apparatus, the surface of the metal-containing resin layer 320 is chemically etched by immersing in, for instance, aceton, isopropyl alcohol, ethanol, a surface active agent or the like. These solvents can easily etch the surface layer 320a composed of the additive formed on the upper surface of the metal-containing resin layer 320.

Then, the metal-containing resin layer 320 which is etched, and exposed at least one portion of the fine metal particles 300b on the surface thereof is treated by, for instance, copper plating using an electroless plating bath (not shown) so that copper is selectively deposited with the fine metal particles 300b exposed on the metal-containing resin layer 320 as kernels to thereby form a conductor metal layer 330 (FIG. 10C).

Note that though a plating bath composed of only electroless plating bath is shown here, it is not limited to this bath, but a plating bath performing both of electroless plating and electroplating can be used.

The thickness of the conductor metal layer 330 formed on the surface of the metal-containing resin layer 320 can be established to a prescribed thickness depending on plating conditions. In order to make the substrate 310 and the metal-containing resin layer 320 come into contact more closely, and prevent from peeling, it is desirable to completely harden the resin layer containing fine metal particle 320 by heat or light irradiation with the fixing apparatus 105, after the plating.

According to one embodiment of the present invention, by adding an appropriate amount of additive such as oil or fat, which is smaller in specific gravity than that of resin composing the resin matrix 300a and is not compatible with the resin matrix 300a, to the resin matrix 300a composing the metal-containing resin particles 300, the surface layer 320a which is composed of an additive easy to be etched, the thickness of the etching being easy to be controlled, can be formed on the surface of the metal-containing resin layer 320. Thereby, the deposition property of the electroless plating can be improved and more uniform conductor pattern layer can be formed.

A production apparatus and a production process using such an electrophotography is a technology used in an ordinary copier or a laser printer, and an arbitrary conductor pattern layer can be formed by inputting digitized data. By applying the metal-containing resin particles 300 according to one embodiment to this technology, a conductor pattern layer excellent in deposition property of plating can be formed. In terms of usage of the metal-containing resin particles 300 according to one embodiment, it is not limited only to an electronic circuit and a wiring substrate, but can be used in a wide range of applications such as forming an arbitrary conductor pattern layer on a flat substrate other than the above-described applications.

Hereinafter, concrete examples of the metal-containing resin particles 300 and the processing performed before electroless plating will be shown.

EXAMPLE 4

In example 4, as for the metal-containing resin particle 300 shown in FIG. 9, two kinds of the metal-containing resin particle 300, one being prepared by adding oil or fat as an additive having specific gravity of 0.98 (at 25° C.) at a rate of 1 vol % of the total volume of the resin matrix 300a to the resin matrix 300a mainly composed of epoxy resin, and the other being prepared by not adding the additive, were used to form an underlying pattern layer (metal-containing resin layer 320) on the substrate by the above-described method of forming a pattern, and carried out experiments on etching process before plating and electroless plating.

The fine copper particles having an average particle size of 0.7 μm is contained at a rate of 50 wt % as the fine metal particles 300b in both metal-containing resin particles 300. The average particle size of the metal-containing resin particles 300 to which the additive is added, is 8.2 μm, and the average particle size of the metal-containing resin particles 300 to which no additive is added, is 8.0 μm. The specific gravity of the resin matrix 300a made of epoxy resin as a main component, which composes the metal-containing resin particles 300 is 1.2 (at 25° C.).

For respective these two underlying pattern layers, one is etched by immersing into a solvent, and the other is not etched. These two were processed by electroless plating.

As a result, the state of deposition of plating became loose irrespective of existence or non-existence of the additive in the case of no etching processing.

On the other hand, when performing electroless plating after immersing the underlying pattern layer in a solvent to subject to etching process, a minute metal conductor layer having a good deposition property was formed with the underlying pattern layer to which the additive was added. In the case of the underlying patter layer without additive, even when it was immersed in a solvent to subject to etching process, the plating hardly deposits, and the state of deposition of plating became loose.

As a result, even in the case of performing an etching process, it was found that the fine copper particles were not exposed sufficiently on the surface of the underlying pattern layer without additive. Furthermore, in the underlying pattern layer to which the additive was added, when it was hardened in the fixing apparatus 105, the additive smaller in specific gravity than that of the resin rised to the surface of the underlying pattern layer to form a surface layer. And it was found that etching of the surface layer in a solvent caused to increase the exposed area of the fine copper particles so that the deposition property of plating was improved.

Thus, by adding an appropriate amount of additive such as oil or fat, which is smaller in specific gravity than that of resin composing the resin matrix 300a and is not compatible with the resin matrix 300a, to the resin matrix 300a composing the metal-containing resin particles 300, it was found that a surface layer which was easy to be etched and the thickness of the etching thereof being easy to be controlled, was formed on the surface of the underlying pattern layer. Thereby, it becomes possible to carry out an effective electroless plating so that a conductor pattern layer more uniform than the pattern layer by a prior art can be formed.

EXAMPLE 5

A metal-containing resin particles 300 in example 5 is formed by containing fine copper particles having an average particle size of 0.7 μm in a resin matrix 300a mainly composed of epoxy resin at a rate of 50 wt %. The average particle size of the metal-containing resin particles 300 is 8.2 μm.

An underlying pattern layer (metal-containing resin layer 320) is formed on a substrate using the metal-containing resin particles 300 by the above-described method of forming the pattern and relations between the percentage of hardening before electroless plating and the deposition property of plating are studied. The percentage of hardening is calculated based on the differential scanning calorimetry (DSC). Incidentally, an etching treatment is executed on the underlying pattern layer before the electroless plating.

From the measurement result of the differential scanning calorimetry (DSC) and the deposition property of plating, when the percentage of hardening of the resin matrix 300a before the electroless plating was 50% or more, it was founded that a minute plating layer was formed. On the other hand, when the percentage of hardening was less than 50%, the state of deposition of plating was loose.

In the case that the percentage of hardening of the resin matrix is less than 50%, dropout of the fine copper particles was recognized here and there when checking the surface of the underlying pattern layer. This is because the resin matrix before hardened is eroded by alkaline electroless plating solution.

From the above result, by making the percentage of hardening of the resin matrix of the underlying pattern layer before electroless plating process to be 50% or more, it was found that the drop out of the fine metal particles was prevented, and the deposition property of the electroless plating could be improved.

Other Embodiments

In the above-described embodiments, conductor pattern layers are mainly explained, but an insulating pattern layer can be formed with an apparatus similar to the production apparatus for forming the conductor pattern layer, by using resin particles composed of the same resin as that composing the resin particles containing fine metal particles. Moreover, by selectively forming the conductor pattern layer and the insulating pattern layer on one substrate, a substrate for electronic circuit can be structured.

Figure 11:
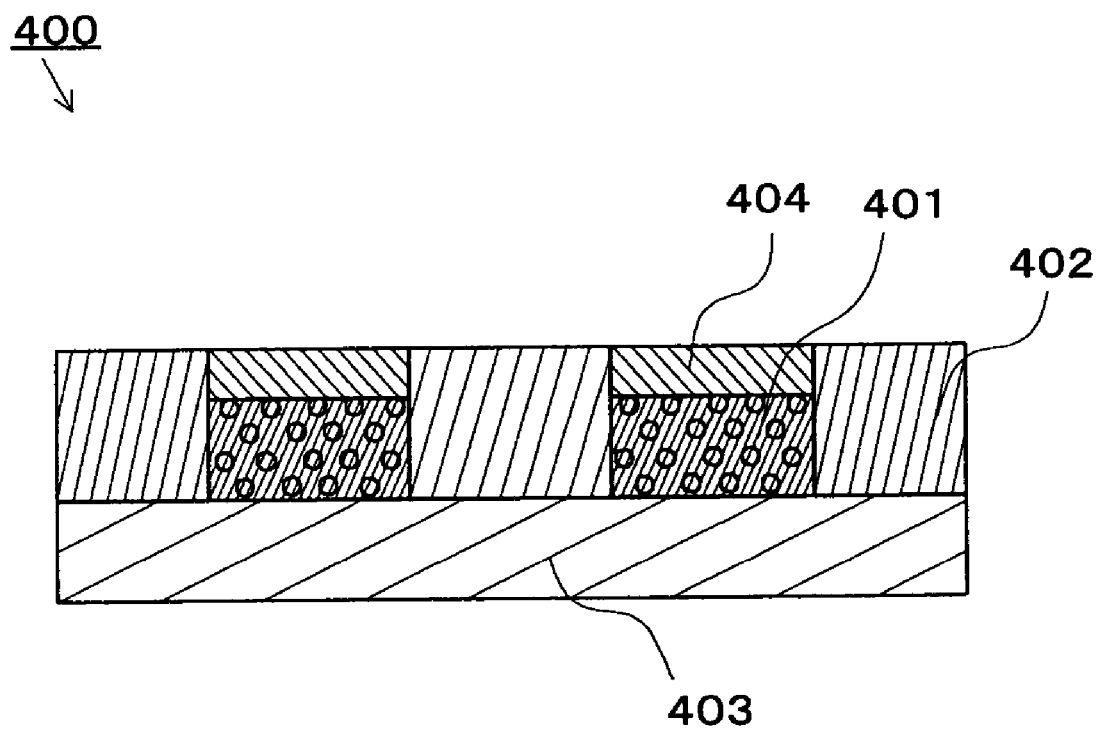
FIG. 11 is a sectional view schematically showing an example of a substrate for electronic circuit.

FIG. 11 shows a schematic sectional view showing an example of an electronic circuit 400 provided with a conductor pattern layer 401 and an insulating pattern layer 402. Note that the conductor pattern layer is formed using the resin particles containing fine metal particles shown in the first embodiment or the second embodiment.

The substrate for electronic circuit 400 comprises, a substrate 403, the non-conductive conductor pattern layer 401 selectively formed on the substrate 403, a conductive conductor metal layer 404 formed on the conductor pattern layer 401, and the insulating pattern layer 402 selectively formed on the substrate 403.

It should be noted that though FIG. 11 shows the substrate for electronic circuit 400 composed of a single layer, a laminated substrate for electronic circuit can be further structured by selectively forming the conductor pattern layer 401, the insulation pattern layer 402, and the conductor metal layer 404 on the electronic circuit shown in FIG. 11.

It should be noted that the present invention is understood not to be limited to a specific mode described here with drawings, however, to include all modification which are within the following claims.

What is claimed is:

1. A metal-containing resin particle for forming a conductor pattern in which metal particles are dispersed in and covered with a resin matrix,
   wherein said resin matrix is composed of thermosetting resin, and a content of said metal particles is 70wt % or less of the whole such that an amount of electrostatic charge is set to within a range of about 5 μC/g to about 22.5 μC/g, and
   wherein said metal particles comprise at least scale shaped metal particles.

2. The metal-containing resin particle according to claim 1,
   wherein number density of said metal particles in a prescribed range of the particle size in said resin particle containing metal particles is 0.05 piece/μm$^3$ or more.

3. The metal-containing resin particle according to claim 1,
   wherein said metal particles comprises at least one kind selected from the group consisting of platinum (Pt), palladium (Pd), copper (Cu), gold (Au), nickel (Ni) and silver (Ag).

4. A metal-containing resin particle for forming a conductor pattern, comprising:
   a resin matrix composed of thermosetting resin;
   metal particles dispersed in said resin matrix such that an amount of electrostatic charge is set within a range of about 5 μC/g to about 22.5 μC/g for said metal-containing resin particle; and
   an additive contained in said resin matrix, and having smaller specific gravity than that of the resin material composing said resin matrix,
   wherein said metal particles comprise at least scale shaped metal particles.

5. The metal-containing resin particle according to claim 4,
   wherein the specific gravity of said additive is 1.1 or less.

6. The metal-containing resin particle according to claim 4,
   wherein said additive is added in the amount of 0.5 vol % or more of the total volume of said resin matrix.

7. The metal-containing resin particle according to claim 4,
   wherein said metal particles comprises at least one kind selected from the group consisting of platinum (Pt), palladium (Pd), copper (Cu), gold (Au), nickel (Ni) and silver (Ag).

8. A metal-containing resin layer formed on a substrate with at least thermosetting resin containing metal particles, wherein the content of said metal particles is 70 wt % or less of the whole such that an amount of electrostatic charge is set to within a range of about 5 µC/g to about 22.5 µC/g for said at least thermosetting resin containing metal particles, and number density of said metal particles contained in a prescribed range of the particle size is 0.05 piece/µm$^3$ or more, and wherein said metal particles comprise at least scale shaped metal particles.

9. A metal-containing resin layer formed on a substrate with at least thermosetting resin containing metal particles, wherein the at least thermosetting resin containing metal particles have an amount of electrostatic charge of within a range of about 5 µC/g to about 22.5 µC/g, wherein the percentage of hardening of the thermosetting resin in the resin layer containing the metal particles before the electroless plating process is 50% or more, and wherein said metal particles comprise at least scale shaped metal particles.

10. A substrate for electronic circuit, comprising:

a conductor pattern layer formed by using the metal-containing resin particles according to claim 1.

11. A substrate for electronic circuit, comprising:

a conductor pattern layer formed by using the metal-containing resin particles according to claim 4.

\* \* \* \* \*